(12) United States Patent
Kwon

(10) Patent No.: US 9,087,588 B2
(45) Date of Patent: Jul. 21, 2015

(54) PROGRAMMABLE NON-VOLATILE MEMORY

(75) Inventor: Euipil Kwon, San Jose, CA (US)

(73) Assignee: Rangduru Inc., San Jose, CA (US)

( * ) Notice: Subject to any disclaimer, the term of this patent is extended or adjusted under 35 U.S.C. 154(b) by 239 days.

(21) Appl. No.: 13/595,426

(22) Filed: Aug. 27, 2012

(65) Prior Publication Data

US 2013/0051113 A1 Feb. 28, 2013

(30) Foreign Application Priority Data

Aug. 26, 2011 (KR) .................. 10-2011-0085734

(51) Int. Cl.
*G11C 17/06* (2006.01)
*G11C 17/18* (2006.01)
*H01L 27/10* (2006.01)
*H01L 27/102* (2006.01)

(52) U.S. Cl.
CPC ............... *G11C 17/06* (2013.01); *G11C 17/18* (2013.01); *H01L 27/101* (2013.01); *H01L 27/1021* (2013.01)

(58) Field of Classification Search
USPC ........................................................ 365/105
See application file for complete search history.

(56) References Cited

U.S. PATENT DOCUMENTS

| 7,521,764 | B2 | 4/2009 | Schoellkopf |
| 7,564,707 | B2* | 7/2009 | Kleveland ............... 365/96 |
| 7,915,095 | B2* | 3/2011 | Herner ................. 438/131 |
| 2005/0001232 | A1* | 1/2005 | Bhattacharyya ....... 257/133 |
| 2007/0133258 | A1* | 6/2007 | Kim ...................... 365/149 |
| 2007/0211535 | A1* | 9/2007 | Kim ................. 365/185.21 |
| 2010/0134141 | A1* | 6/2010 | Bertin et al. ............ 326/39 |
| 2013/0249017 | A1* | 9/2013 | Kwon ................... 257/379 |

FOREIGN PATENT DOCUMENTS

| KR | 1997-0067848 | 10/1997 |
| KR | 2001-0056831 | 7/2001 |

* cited by examiner

*Primary Examiner* — Hoai V Ho
*Assistant Examiner* — Pablo Huerta
(74) *Attorney, Agent, or Firm* — Goldilocks ZONE IP Law

(57) ABSTRACT

A programmable non-volatile memory including a memory cell includes a transistor acting as an anti-fuse and two diodes for access. The memory cell that can store two bits and includes a transistor acting as an anti-fuse and two diodes for access, wherein the cell transistor includes: the source electrode formed by a metal; the first diode as the source region contact structure; the drain electrode formed by a metal; and the second diode as the drain region contact structure wherein the cell transistor, the oxide layer between the source area and the gate is the first anti-fuse the first storage; the oxide layer between the drain area and the gate is the second anti-fuse the second storage; the two diodes are connected in series to access the two anti-fuses.

16 Claims, 17 Drawing Sheets

PROGRAMMABLE NON-VOLATILE MEMORY

CROSS-REFERENCE TO RELATED APPLICATIONS

This application claims the benefit of Korean Patent Application No. 10-2011-0085734, filed on Aug. 26, 2011, in the Korean Intellectual Property Office, the disclosure of which is incorporated herein in its entirety by reference.

BACKGROUND

1. Filed

One or more embodiments relate to a one-time-programmable non-volatile memory device, and more particularly relates to a programmable non-volatile memory device, including a transistor acting as an anti-fuse and two diodes for access.

2. Related Art

Korea Patent Publication 10-2001-0056831 relates to a method of making an anti-fuse of the semiconductor device, and more particularly relates to a method of making an anti-fuse of the semiconductor device using a right-angled corner of the semiconductor substrate to cause the breakdown of the insulator layer at a lower voltage, wherein the method of making an anti-fuse of the semiconductor device comprises: a step making right-angled corners by forming regular pattern on the semiconductor substrate that finished front end process; a further step depositing the gate oxide layer then stacking nitride layer and the first poly-silicon layer on top of the gate oxide layer; a further step forming a photo-resist pattern to expose the first poly-silicon layer at the right-angled corner of the semiconductor substrate; a further step exposing primarily the nitride layer at the right-angled corner of the semiconductor substrate by dry-etching the exposed first poly-silicon layer; a further step dry-etching the nitride layer; a further step depositing/patterning the second poly-silicon layer.

Korea Patent Publication 10-1997-0067848 relates to a semiconductor memory device and to methods for its fabrication, wherein the memory device improves the processing speed of the semiconductor memory device owing to consistent charge supply to the storage node capacitor because it comprises: an access transistor T to access the word line information, a storage node capacitor C to store the information at the access transistor T through the bit line, and a chare-up transistor P to supply charges to the storage node capacitor.

By the way, the non-volatile semiconductor memory is a semiconductor memory that can keep the information stored in the memory cell without power supply.

Such one-time-programmable non-volatile memory devices are electrically programmed, wherein the data storage principle of the memory device is to use a resistive path formed by applying a high programming voltage across the gate oxide layer to cause the gate breakdown.

According to a prior art, FIG. 1 illustrates the cross-section of the storage n-channel MOS transistor 990. As illustrated in FIG. 1, it is a typical n-channel MOS transistor includes: a thin oxide layer 935, a poly-silicon gate 940 on top of the oxide layer, sidewall spacers 925 formed on the side of the gate, source region 926 and drain region 927 doped with high and low concentration in n-type separated by the gate 940 in between, a semiconductor substrate 915 doped with low concentration in p-type. The basic principle of programming is to connect the gate 940 of the storage n-channel MOS transistor 990 to the ground GND at 0V and to apply a high voltage either to the source region 926 or drain region 927 to cause the gate breakdown at the oxide layer making a resistive path. Therefore, a high voltage needed to be applied to the source region 926 or drain region 927 to access MOS transistor. As the paths that the gate breakdown occur, a resistive path 936 formed on the oxide layer 935 between the gate 940 and source region 926; and another resistive path 937 formed on the oxide layer 935 between the gate 940 and drain region 927 are illustrated in thick lines to help understanding. It is a disadvantage that a thick oxide layer MOS transistor is needed in the access MOS transistor to be suitable for high voltage operation while a thin oxide layer MOS transistor is used in the storage MOS transistor 990. It is also a disadvantage that the need of the access transistor is the fundamental limitation in increase of the integration density.

According to an aspect of the prior art, FIG. 2 illustrates the circuit diagram about a memory cell 910 including two access n-channel MOS transistors and one storage n-channel MOS transistor. As illustrated in FIG. 2, the gate of the storage n-channel MOS transistor 900 is grounded to the ground GND at 0V; the gates of each access n-channel MOS transistor 901, 902 are connected to each word lines WL0, WL1; the drains of each access n-channel MOS transistor 901, 902 are connected to the common bit line BL; the sources of each access n-channel MOS transistor 901, 902 are connected to the source 956 and drain 957 of the storage n-channel MOS transistor 900 respectively.

As described previously, the device includes the access transistors and it is the fundamental limitation in increase of the integration density.

As described previously, the high voltage should be transferred through the access n-channel MOS transistors 901, 902 to apply the high voltage for programming to the source 956 or drain 957 of the storage n-channel MOS transistor 900. Therefore, a high voltage should be applied to the common bit line BL and a higher voltage should be applied to the selected word line WL0 or WL1.

According to the prior art, the fabrication process becomes relatively complicated because the memory cell should be fabricated in high density MOS transistors with two different oxide layer thicknesses. Further, three transistors are required to make a two-bit storable memory cell, being the fundamental limitation in increase of the integration density.

SUMMARY OF THE INVENTION

An aspect of present invention, a programmable non-volatile memory comprising a cell transistor, the cell transistor including: a source region formed in a substrate; a drain region formed in the substrate and separately from the source region; an oxide layer formed on a region of the substrate located between the source region and the drain region and on a portion of the source region; and a portion of the drain region to form a first anti-fuse and a second anti-fuse; a gate formed on the oxide layer; a source electrode formed by a conductive material on the source region except the portion of the source region to form a first diode; and a drain electrode formed by a conductive material on the drain region except the portion of the drain region to form a second diode.

An aspect of the present invention, a memory cell and operation method thereof, includes a transistor and two diodes to improve the integration density than the prior arts in making a two-bit storable memory cell.

Another aspect of the present invention provides a structure and its operation method, forming two diodes without additional area in making the transistor to improve the integration density.

Another aspect of the present invention provides a semiconductor memory device containing multiple cells of the memory and operation method thereof.

Another aspect of the present invention provides a memory array, a semiconductor memory device containing the array, and its operation method, in contrary to the prior arts, including only thin oxide layer MOS transistors to make the fabrication process easier and to reduce the cell region.

These aspects of the present invention are not limited to what described above. Other aspects and advantages that are not described can be understood by explanations below and can be further clarified by exemplary embodiments. Furthermore, it will be easily understandable that the aspects and advantages of the present invention can be realized by the means in the claims and their combinations.

An aspect of the present invention is a programmable non-volatile memory wherein the memory cell can store two bits and includes a transistor acting as an anti-fuse and two diodes for access. The cell transistor includes: the source electrode formed by a metal; the first diode as the source region contact structure; the drain electrode formed by a metal; and the second diode as the drain region contact structure. Wherein the cell transistor, the oxide layer between the source region and the gate is the first anti-fuse the first storage; the oxide layer between the drain region and the gate is the second anti-fuse the second storage; the two diodes are connected in series to access the two anti-fuses.

The diodes are Schottky diodes include source/drain electrodes formed by a metal and the contact structures of the source/drain region are lightly doped.

The anode of the first diode connects to a source side SS; the anode of second diode connects to the drain side DD; the body of the cell transistor connects to VSB; the first anti-fuse and first diode have the gate as a common electrode; the gate connects to the GG; the first anti-fuse and first diode forms the first bit cell storing single-bit in series connection structure sharing the source region; the second anti-fuse and second diode forms the second bit cell storing single-bit in series connection structure sharing the drain region.

The GG connects to the word line and the SS/DD connects to the bit line.

Or conversely the GG connects to the bit line and the SS/DD connects to the word line.

A voltage is applied across the anti-fuses to cause gate breakdown at the gate oxide layer anti-fuses, creating a resistive path.

GG is biased to 0V while VSB is in floating state during the programming operation of the memory cell, wherein SS is biased to a programming voltage VPP during the first bit cell programming, wherein DD is biased to a programming VPP during the second bit cell programming, wherein SS is in floating state to protect the first bit cell programming while the programming operation, wherein DD is in floating state to protect the second bit cell programming while the programming operation.

During the write operation connecting GG to the word line and the SS and DD to their respective bit lines, the column decoder includes a bit-line pre-charge circuit comprising transistors that pre-charge the bit-lines BL0, BL1 to VHH voltage and controlled by receiving a write pre-charge signal WPB.

The read circuit needed for a read operation that connects GG to the word line and the SS and DD to their respective bit lines includes bit lines connected to global bit lines GBL0, GBL1 and selected by column decoder. The read circuit further includes transistors to pre-charge the global bit lines GBL0, GBL1 to VCC voltage. The read circuit further includes a sense amplifier that detects the stored data transferred from the bit lines BL0, BL1 to global bit lines GBL0, GBL1.

According to an aspect of present invention, a memory device may include cell transistors including: a memory array arranging multiple the memory cells; a VSB supply generating VSB used for the memory array; a row decoder to select a word line in the memory array; a VPP supply generating VPP and VHH and supplying to the row decoder, a column decoder, and write circuit; the column decoder selecting a bit line; a write circuit transferring the supplied data bus from input/output circuits to a global bit line bus GBL under a controller's control; a read circuit transferring the stored data to the global bit line GBL, sensing a electrical status of GBL by a sense amplifier, amplifying/converting to a digital signal, and transferring to the input/output circuit. During the write operation connecting the SS and DD to their respective word lines, the column decoder includes a bit-line pre-charge circuit including transistors that pre-charge the bit-lines BL0, BL1 to VPP voltage and controlled by receiving write pre-charge signal WPB.

The read circuit used for a read operation that connects GG to the bit line and the SS and DD to their respective word lines includes bit-lines BL0, BL1 connected to global bit-lines GBL0, GBL1 and selected by column decoding; transistors to pre-charge the global bit-lines GBL0, GBL1 to 0V; and sense amplifiers detecting the stored data transferred from the bit lines BL0, BL1 to global bit lines GBL0, GBL1.

The diodes are either typical P-N junction diodes or any devices with uni-directional current characteristics, besides Schottky diodes comprise source/drain electrodes formed by a metal and the contact structures of the source/drain region are lightly doped.

In the memory cell configuration can have opposite connection of diode such that the cathode of the first diode connects to the source side SS, wherein the cathode of second diode connects to the drain side DD, wherein the body of the cell transistor connects to VSB, wherein the first anti-fuse and first diode have the gate as a common electrode, wherein the gate connects to GG, wherein the first anti-fuse and first diode forms the first bit cell storing single-bit in series connection structure sharing the source region, wherein the second anti-fuse and second diode forms the second bit cell storing single-bit in series connection structure sharing the drain region.

0 V is applied to the selected word line while other unselected word lines are pre-charged to a VPP voltage and left to the floating state during a write operation of memory array that connects GG to the word line and the SS and DD to their respective bit lines.

A VPP voltage is applied to the selected word line while other unselected word lines are pre-charged to a VHH voltage and left to the floating state during a write operation of memory array that connects GG to the bit line and the SS and DD to their respective word lines.

The present subject matter requires a single transistor while prior arts require three transistors to make a two-bit storable memory cell. Based on the number of transistors, an aspect of the present invention has an advantage to increase the integration density by a factor of three.

Another advantage of the aspect of present invention is that its fabrication process is easier and area-efficient because it only requires a single thin oxide layer thickness while prior arts require two oxide layer thicknesses—a thinner oxide used for the storage transistor and a thicker oxide used for the access transistor applying a high voltage for programming.

DETAILED DESCRIPTION OF THE INVENTION

Figure 1:
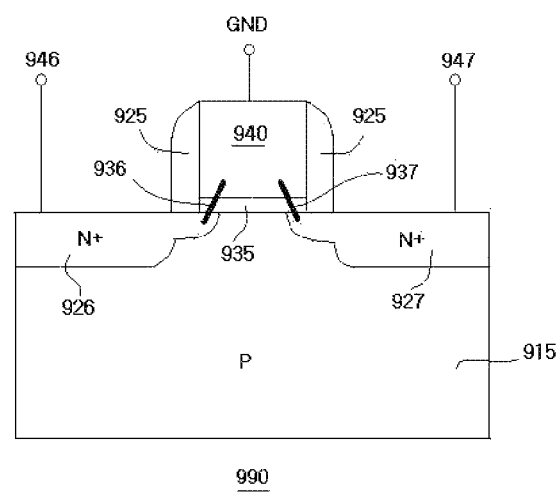
FIG. 1 is a cross-sectional view of a storage MOS transistor in the prior arts.
Figure 2:
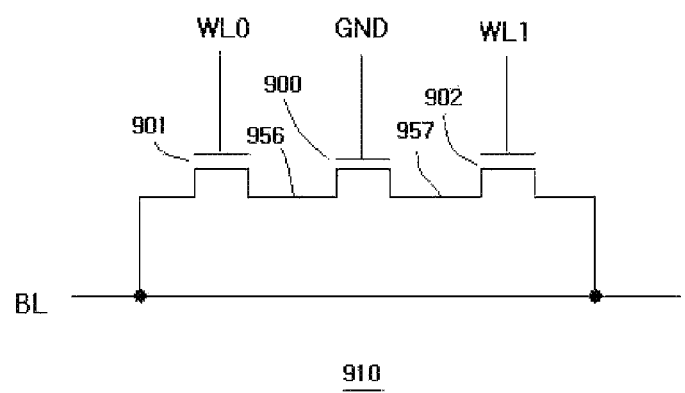
FIG. 2 illustrates a circuit diagram of the memory cell in the prior arts.

An aspect or aspects of present invention will now be described more fully with reference to the accompanying drawings, in which exemplary embodiments of the invention are shown.

The embodiments of the present invention are provided to fully describe the present inventive concept to those of ordinary skill in the art, may be embodied in many different forms, and should not be construed as being limited to the embodiments set forth herein; rather, these embodiments are provided so that this disclosure will be thorough and complete, and will fully convey the concept of the present inventive concept.

The terminology used in the application is used only to describe specific embodiments and does not have any intention to limit the inventive concept. An expression in the singular includes an expression in the plural unless they are clearly different from each other in a context. In the application, it should be understood that terms, such as "comprise" and/or "comprising", are used to indicate the existence of implemented feature, number, step, operation, element, part, and/or a combination of them without excluding in advance the possibility of existence or addition of one or more other features, numbers, steps, operations, elements, parts, and/or combinations of them. As used herein, the term "and/or" includes any and all combinations of one or more of the associated listed items.

Although terms, such as 'first' and 'second', can be used to describe various elements, areas, and/or parts, the elements, components, areas, layers, and/or parts cannot be limited by the terms. The terms can be used not to indicate specific sequences, top and bottom, or superiority and inferiority but to classify a certain element, area, or part from another element, area, or part. Thus, a first element, area, or part can be named a second element, area, or part without leaving from the right scope of the inventive concept.

The embodiments of the present invention will now be described with reference to drawings in which ideal embodiments are schematically shown. In the drawings, modifications in shapes may be predicted according to, for example, manufacturing techniques and/or tolerant. Thus, the embodiments of the present invention should not be construed as being limited to a specific shape in an area shown in the specification and should include modifications in shapes caused by manufacturing.

The present inventive concept will now be described in detail by describing exemplary embodiments with reference to the accompanying drawings. However, the present inventive concept may not be limited to the embodiments set forth herein, and may be embodied in many different forms; rather, these embodiments are provided so that this disclosure will be complete, and will fully convey the scope of the present inventive concept to those of ordinary skill in the art. In the drawings, the thicknesses of components may be exaggerated for convenience of description.

The terms used in the embodiments described below may have meaning commonly known in the technical field of the present inventive concept. For example, at least one indicates one at minimum, i.e., one or more number, and may be used as the same meaning with a singular or plural number.

The present subject matter includes the MOS device formed on either a semiconductor bulk silicon substrate or a semiconductor silicon-on-insulator often called SOI substrate.

Referring now data "1" corresponds to the state that the gate oxide layer of the cell transistor has no resistive path; data "0" to the state that the gate oxide layer of the cell transistor has a resistive path. They could be defined conversely thus the present subject matter is not limited to these specific definitions.

Referring now, with respect to the write and read circuits and their operations, BL0 and BL1 correspond to bit-lines;

GBL0 and GBL1 correspond to the global bit-lines; WD0 and WD1 correspond to write data input signals; RD0 and RD1 corresponds to read data output signals. They are simplified by 2-bit data buses to accommodate easy explanation of embodiments of the present subject matter thus the present subject matter is not limited to these specific representations.

Figure 3:
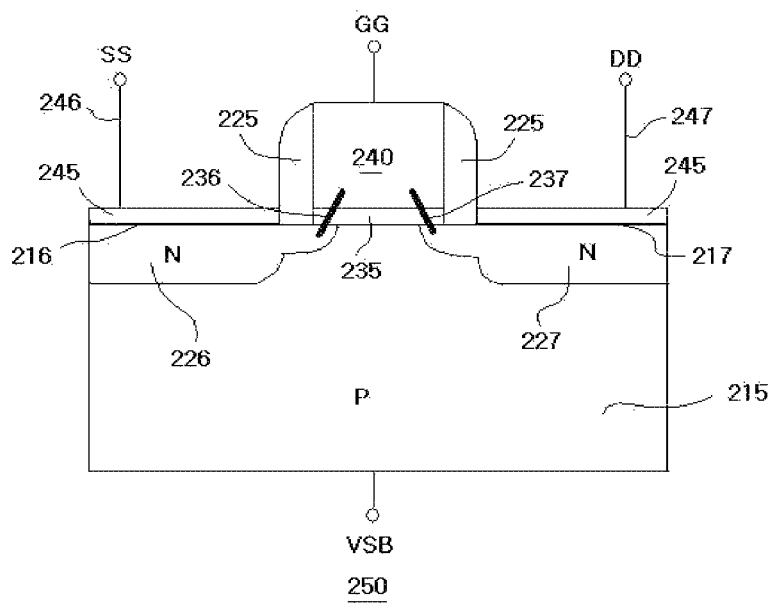
FIG. 3 is a cross-sectional view of the memory cell according to an aspect of present invention.

The cross-sectional view of a memory cell 250 is illustrated in FIG. 3 according to an aspect of present invention.

Figure 4:
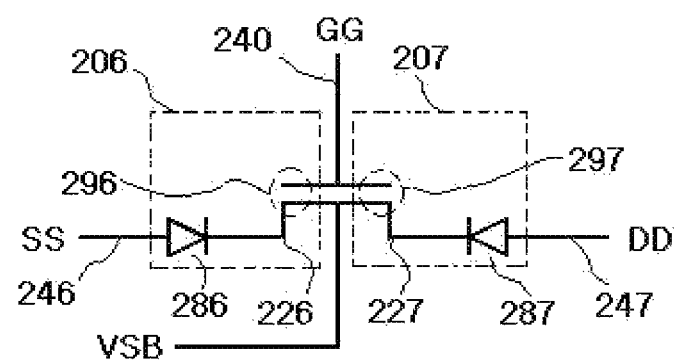
FIG. 4 illustrates a circuit diagram of the memory cell according to an aspect of present invention.

FIG. 4 is the circuit diagram of the memory cell 250 illustrated in FIG. 3 according to an aspect of present invention.

Figure 5:
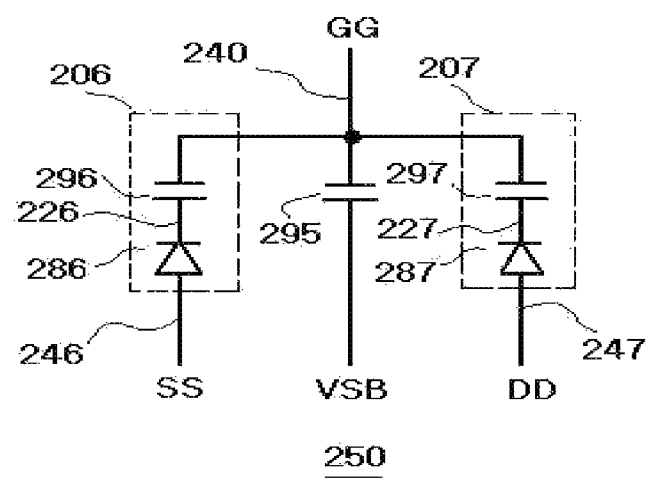
FIG. 5 illustrates a simplified equivalent circuit diagram illustrating the pre-program state of the memory cell representing the oxide layer by an anti-fuse according to an aspect of present invention.

FIG. 5 is a simplified equivalent circuit diagram illustrating the anti-fuse and diodes to accommodate understanding of the memory cell 250 according to an aspect of present invention.

The memory cell 250 may include one transistor and two diodes as illustrated in FIG. 3 and FIG. 4.

A programmable nonvolatile memory is a two-bit storable memory cell that includes a memory cell including a transistor acting as an anti-fuse and two diodes to access the transistor.

The cell transistor includes: the source electrode formed by a metal; the first diode as the source region contact structure; the drain electrode formed by a metal; and the second diode as the drain region contact structure.

The cell transistor, the oxide layer between the source area and the gate is the first anti-fuse the first storage; the oxide layer between the drain area and the gate is the second anti-fuse the second storage. It is understood that the two diodes are connected in series to access the two anti-fuses. However, it is not limited thereto.

Describing more specific process of the memory cell, the diodes are created by forming Schottky diodes at the contact structure 216 between the source electrode 246 and source region 226; the contact structure 217 between the drain electrode 247 and drain region 227.

According to an aspect of present invention, the memory cell 250 may be an n-channel MOS transistor to protect channel formation when 0V is applied to the gate. However, a p-channel MOS transistor can be used when different voltage is used thus the n-channel MOS transistor also may be used.

As illustrated in FIG. 3, the memory cell 250 has a polysilicon gate 240 placed on top of a thin oxide layer 236 like typical n-channel MOS transistor. Wherein a sidewall spacer 226 is formed on side of the gate 240; source region 226 drain regions 227 are doped with low concentration in n-type separated by the gate 240 in between; a semiconductor substrate 215 is doped with low concentration in p-type.

It is understood that the semiconductor substrate 215 is not limited to being doped by p-type but also includes forming by p-type well.

The source region 226 has a contact structure with the source electrode 246 deposited with silicide 245. Similarly, the drain region 227 has a contact structure with the drain electrode 247 deposited with silicide 245.

It is understood that the structure of an aspect of the present invention also may include an embodiment that replaces the silicide 245 to metal.

In typical MOS transistors, the contact structure 216 between the source electrode 246 & source region 226 and the contact structure 217 between the drain electrode 247 & drain region 227 are ohmic contacts because the source region 226 and drain region 227 are doped with high concentration. However, as illustrated in FIG. 3, the embodiment of the present subject matter dopes the source region 226 and drain region 227 with low concentration to form Schottky diodes, unlike typical MOS transistor. It is understood that the low concentration may be an order of 1E15-1E18 $cm^3$ or less.

As widely known, a Schottky diode is formed when low-doping semiconductor and metal are in contact. As the theory, the contact structure 216 between the source electrode 246 & source region 226 becomes a Schottky diode, defining the first diode; the contact structure 217 between the drain electrode 247 & drain region 227 becomes another Schottky diode, defining the second diode.

Referring now, as the single-transistor including a memory cell, a cell transistor is defined as the transistor including two diodes.

A structure that the transistor may include two diodes to enhance the integration density according to an aspect of present invention.

In the memory cell configuration of an aspect of the present invention, the transistor can be any typical MOS transistor and the diode can be any typical diode.

Therefore, the memory cell can include a single cell transistor that includes two diodes without additional area for diodes according to an aspect of present invention.

Namely, the area of the memory cell is the same as the area that single transistor occupies.

A cell transistor is a basic MOS device structure including a gate oxide layer that can be used as two anti-fuses according to an aspect of present invention.

An oxide layer between a source area 226 and a gate 240 becomes the first anti-fuse 296; the oxide layer between a drain area 227 and a gate 240 becomes the second anti-fuse 297, respectively.

The first anti-fuse 296 and first diode 286 form the first bit cell 206 storing single-bit in series connection structure sharing the source region 226.

The second anti-fuse 297 and second diode 287 form the second bit cell 207 storing single-bit in series connection structure sharing the drain region 227.

Wherein one electrode of the first anti-fuse 296 and the second anti-fuse 297 connect to the gate 240 in common; the gate 240 connects to GG.

An anode of the first diode connects to a source side SS, wherein the anode of second diode connects to a drain side DD.

FIG. 5 illustrates a simplified equivalent circuit diagram illustrating the pre-program state of the memory cell representing the oxide layer by an anti-fuse 296, 297 according to an aspect of present invention.

During the programming of the memory cell 250, an enough high voltage is applied across the anti-fuses to cause gate breakdown at the gate oxide layer anti-fuses, creating a resistive path. Referring now, a VAF voltage corresponds to the high voltage.

A power supply VCC is typically to make the electric field across the gate oxide layer about 5 MV/cm; the electric field required to cause a gate breakdown at the gate oxide layer is about 20 MV/cm according to an aspect of present invention. However, it is not limited thereto.

For example, in the process technology with minimum gate feature length of 130 nm and gate oxide layer thickness of 2.3 nm, a VCC voltage may be about 1.2V; The VAF voltage to cause the gate breakdown is about 5V.

Therefore, applying the example, a desirable VPP voltage for programming is about 5.3V. A VHH voltage to be the later is set to about 2.2V—a half of the VPP voltage. However, it is not limited thereto.

GG is biased to 0V while VSB is in floating state during the programming operation of the memory cell according to an aspect of present invention.

SS is biased to the VPP voltage during the first bit cell 206 programming; DD is biased to the VPP voltage during the second bit cell 207 programming.

SS is in floating state to protect the first bit cell programming while the programming operation; DD is in floating state to protect the second bit cell programming while the programming operation.

Referring now it will be explained that GG is biased to 0 V while SS is biased to VPP voltage in the first bit cell 206.

VPP minus a threshold voltage of a diode 286 is applied to the cathode 226 of the first diode i.e. the source region 226.

For example, if the threshold voltage of the diode 286 is 0.2 to 0.3V, VPP voltage of the example is about 5.3V. Then the voltage across the anti-fuse is about VAF voltage 5V thus it creates a resistive path. Namely, it is programmed, storing data "0". FIG. 3 illustrates the resistive path 236 in thick line to help understanding.

Figure 6:
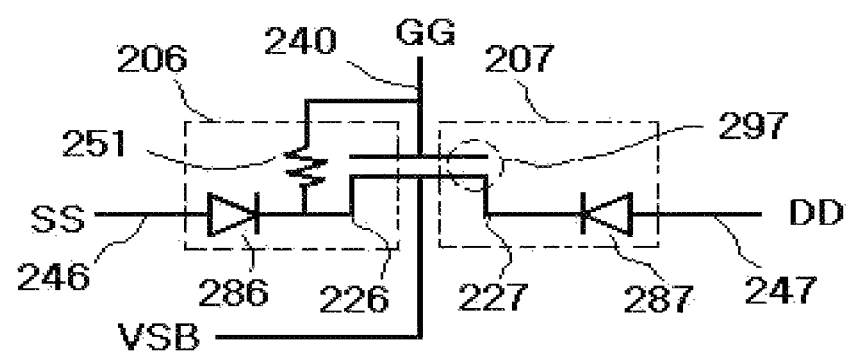
FIG. 6 illustrates an equivalent circuit diagram illustrating the post-program state of the first bit cell in the memory cell according to an aspect of present invention.

As illustrated in FIG. 6, the resistive path is represented by a resistor.

As illustrated in FIG. 6, the equivalent circuit of the memory cell 250 after programming the first bit cell 206 has the resistive path represented by a resistor.

Referring now another example will be explained that GG is biased to 0 voltage while DD is biased to VPP voltage in the second bit cell 207. The second bit cell 207 has an identical structure with the first bit cell 206 thus is programmed like the first bit cell 206. FIG. 3 illustrates the resistive path 237 in thick line to help understanding.

In an example embodiment of the memory cell 250 of the present subject matter, GG connected to the gate 240 is biased to 0V if it is selected; or, becomes a floating state pre-charged at VPP voltage if it is not selected during the programming operation.

While VSB connected to the semiconductor substrate 215 is typically biased to 0V, it becomes a floating state during the programming operation. This is to minimize the voltage difference between the gate 240 and VSB and to block the current path so that it prevents the gate breakdown at the gate oxide layer 235 between the gate 240 and the channel region.

During the read operation of the memory cell, the diode between GG and SS/DD is forward-biased to a level higher than the threshold voltage of the diode.

In FIG. 6, if GG is biased to 0V and SS/DD are biased to a level higher than the sum of the threshold voltage of a diode and voltage drop across the resistive path 251, the first diode 286 is forward-biased thus a current flows.

However, the second anti-fuse 297 is a capacitor in insulation state, no current flows in the second diode 287 after the second anti-fuse 297 is charged enough.

It can be detected that the first anti-fuse 296 has a resistive path and the second anti-fuse 297 does not have a resistive path by sensing the current flow through a read circuit.

A memory array includes multiple of the memory cell 250 in column and row. It is integrated into a memory device.

As explained earlier, there are two methods in connection of word line and bit line in the memory cell 250. One has GG connected to word line; SS and DD connected to bit lines respectively. Referring now memory array-A corresponds to such a configuration.

Conversely, another one has GG connected to bit line; SS and DD connected to word lines respectively. Referring now memory array-B corresponds to such a configuration.

Figure 7A:
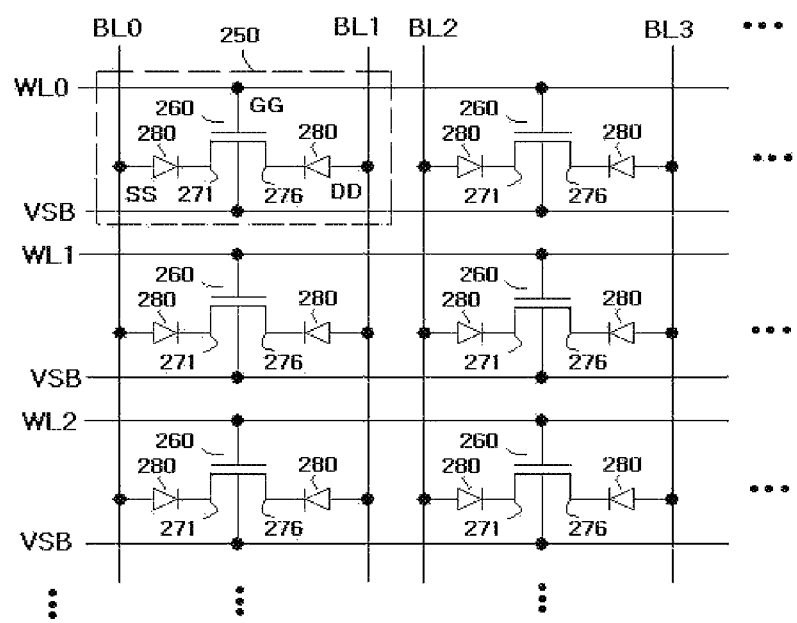
FIG. 7a illustrates a circuit diagram of the memory array-A according to an aspect of present invention.

The memory array-A in the present subject matter is as illustrated in FIG. 7a.

Figure 7B:
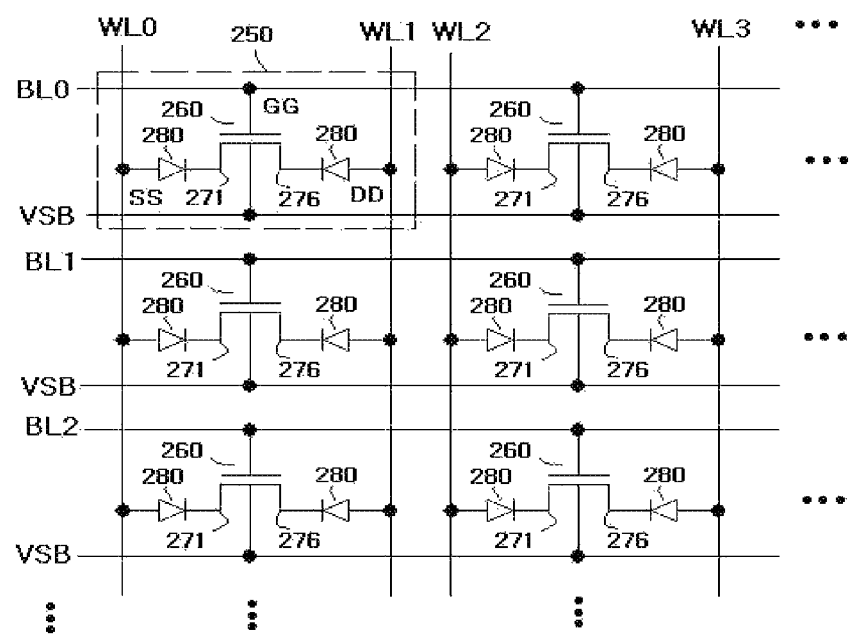
FIG. 7b illustrates a circuit diagram of the memory array-B according to an aspect of present invention.

The memory array-B in the present subject matter is as illustrated in FIG. 7b.

As illustrated in FIG. 7a, memory array-A 140 has multiple memory cells 250 integrated in a matrix structure.

As illustrated in FIG. 7b, memory array-B 142 has multiple memory cells 250 integrated in a matrix structure.

As illustrated in FIG. 7a, SS/DD of the memory cell are connected to SS/DD of other memory cells and arranged in a column, forming bit line buses BL0, BL1, BL2, . . . BLN.

The bit line buses exchange data with read and write circuits in connection with global bit lines GBL0, GBL1, GBL2 . . . GBLN when they are selected by a column decoder 160, 162 (see FIGS. 9a and 9b).

As illustrated in FIG. 7b, GG of the memory cell are connected to GG of other memory cells and arranged in a column, forming bit line buses BL0, BL1, BL2 . . . BLN.

The bit line buses exchange data with read and write circuits 170, 180 in connection with global bit lines GBL0, GBL1, GBL2 . . . GBLN when they are selected by the column decoder.

During the write operation of memory array-A, the column decoder includes a bit-line pre-charge circuit comprising transistors that pre-charge the bit-lines BL0, BL1 to VHH voltage and controlled by receiving a write pre-charge signal WPB.

The global bit lines GBL0, GBL1, GBL2 . . . GBLN is either biased to VPP voltage or set to the floating state depending on the control of the write circuit and data. The write data input signals WD0, WD1 are either biased to VPP voltage to cause programming through a level shifter, pull-up transistor, and pass transistor; or set to the floating state to protect programming. The signals are transferred to the bit lines BL0, BL1 selected by the column decoder.

During the write operation of memory array-B of the present subject matter, the column decoder includes a bit-line pre-charge circuit including transistors that pre-charge the bit-lines BL0, BL1 to VPP voltage and controlled by receiving the write pre-charge signal WPB.

The global bit lines GBL0, GBL1, GBL2, . . . is either biased to 0 voltage or set to the floating state depending on the control of the write circuit and data. The write data input signals WD0, WD1 are either biased to 0 V to cause programming through an inverter, pull-down transistor, and pass transistor; or set to the floating state to protect programming. The signals are transferred to the bit lines BL0, BL1 selected by the column decoder.

Therefore, the data is stored as data "0" or data "1". For the data storing, the write data input signals WD0, WD1 are put as logic level "0" or logic level "1".

During the read operation of memory array-A, the stored state in the selected cell transistor is converted into a digital data by a sense amplifier that detects and amplifies the electrical state of the bit line. The read circuit needed for the read operation includes transistors connected to global bit-lines GBL0, GBL1 to pre-charge the global bit-lines GBL0, GBL1 to VCC voltage; and sense amplifiers detecting the stored data transferred from the bit lines BL0, BL1 to global bit lines GBL0, GBL1.

During the read operation of memory array-B, the stored state in the selected cell transistor is converted into a digital data by a sense amplifier that detects and amplifies the electrical state of the bit line. The read circuit used for the read operation includes transistors connected to global bit-lines GBL0, GBL1 to pre-charge the global bit-lines GBL0, GBL1 to 0 volt; and sense amplifiers detecting the stored data transferred from the bit lines BL0, BL1 to global bit lines GBL0, GBL1.

The sense amplifier operates when a SAE becomes the logic level "1", amplifying, latching, and sending the voltage difference between the reference voltage VREF and input signals GBL0, GBL1 to output terminals RD0, RD1.

In further details as illustrated in FIG. 7a, GG of the memory cell are connected to GG of other memory cells and arranged in a row, forming word line buses WL0, WL1, WL2, WL3, WL4, . . . . The word line buses are connected to the output terminal of the row decoder and selected by the row decoder.

As illustrated in FIG. 7b, SS and DD of the memory cell are connected to SS and DD of other memory cells and arranged in a row, forming word line buses WL0, WL1, WL2, WL3, WL4, . . . . The word line buses are connected to the output terminal of the row decoder and selected by the row decoder.

The body of the cell transistor 260 is a p-well and connected to VSB with other cell transistors 260.

In memory array-A 140 and memory array-B 142, data is stored by programming the cell transistor of the memory cell selected by the word line and bit line.

The data is programmed along the word line selected by the row decoder, depending on the electrical state of the bit line selected by the column decoder.

Data "1" is defined as the state that does not have a resistive path in the gate oxide layer anti-fuse; data "0" is defined as the state that has a resistive path in the gate oxide layer anti-fuse according to an aspect of present invention.

Therefore, all the data is stored as "1" in the initial state. To store data "0", a resistive path has to be formed in the gate oxide layer anti-fuse of the selected cell transistor.

Conversely to store data "1", forming a resistive path has to be avoided in the gate oxide layer anti-fuse of the designated cell transistor even if it is selected by word line and bit line.

Namely, it should be protected from programming thus the selected bit line should be in the floating state.

During the programming operation of memory array-A, the selected word line is biased to 0V; other unselected word lines are set to the floating state, pre-charged at a VPP voltage according to an aspect of present invention.

During the programming operation of memory array-B, the selected word line is biased to a VPP voltage; other unselected word lines are set to the floating state, pre-charged at the VHH voltage according to an aspect of present invention.

Figure 8A:
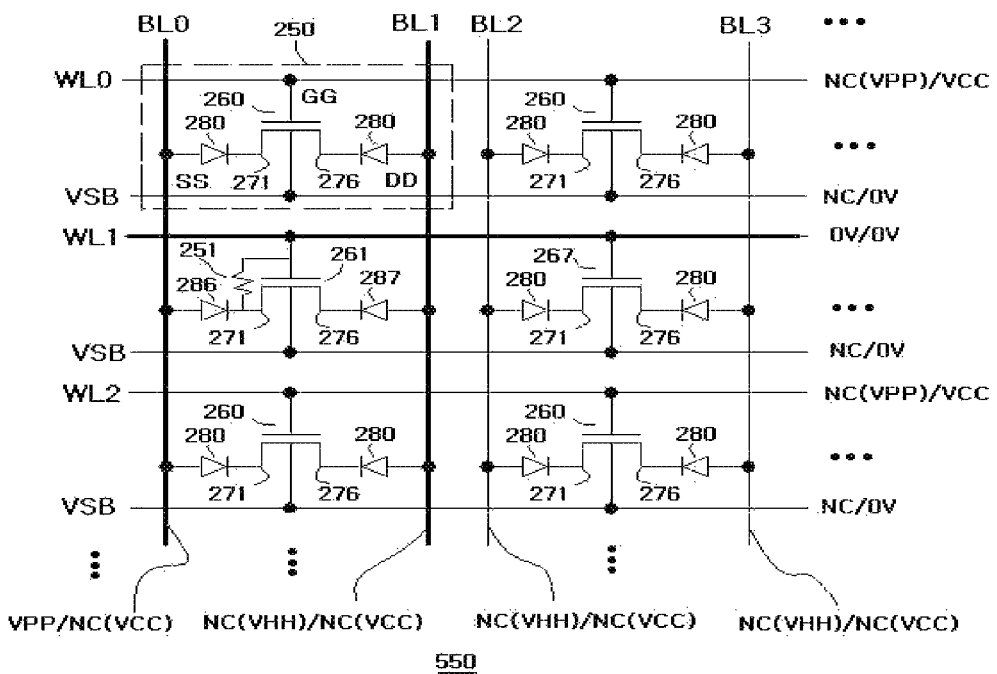
FIG. 8a illustrates a circuit diagram of the memory array-A illustrating the programming and read operations according to an aspect of present invention.

As illustrated in FIG. 8a, the programming operation in the memory array-A is according to an aspect of present invention.

As illustrated in FIG. 8a, selection of WL1, BL0, and BL1 is shown in thick lines to help understanding as an example embodiment the present invention.

In an example embodiment the present invention, the selected word line WL1 is biased to 0 voltage in the floating state; other unselected word lines remain in the floating state.

Further VSB and unselected bit lines BL2, BL3, . . . become the floating state.

Storing data "0" through BL0 and data "1" through BL1 is an example embodiment the present subject matter.

As described earlier in detail, BL0 is biased to a VPP voltage to store data "0", BL1 is set to the floating state to store data "1".

Further, the selected word line WL1 is biased to 0V and BL0 to the VPP voltage to forward-bias the first diode 286.

Therefore, the voltage at the source region 271 of the cell transistor becomes the VPP voltage minus a threshold voltage of a diode Vd.

As a result, the voltage across the gate GG and source region 271 of the cell transistor 261 is a high voltage that is VPP voltage minus the threshold voltage of a diode Vd. According to the example described earlier in detail regarding the VPP voltage, a voltage VAF is 5V since the VPP voltage is about 5.3V according to an aspect of present invention. However, it is not limited thereto.

Therefore, a gate breakdown occurs in the gate oxide layer, the first anti-fuse in between, creating a resistive path. Namely, it is programmed as data "0".

On the other hand, BL1 is in the floating state regardless WL1. Therefore, the drain region 276 of the cell transistor 261 is also in the floating state similar to BL1 even if the second diode 287 is forward-biased.

Hence, a high voltage is not applied across the gate GG and drain region 276 even if WL1 connected to the gate is biased to 0V in the cell transistor 261.

Thus, a gate breakdown does not occur in the gate oxide layer, the second anti-fuse in between, nor creating a resistive path. Namely, it is protected from programming and data "1" is stored since the initial storage state is preserved.

The selected bit lines BL0, BL1 include a column decoder and write circuits, becoming a path to enter the data required for the programming operation.

Figure 8B:
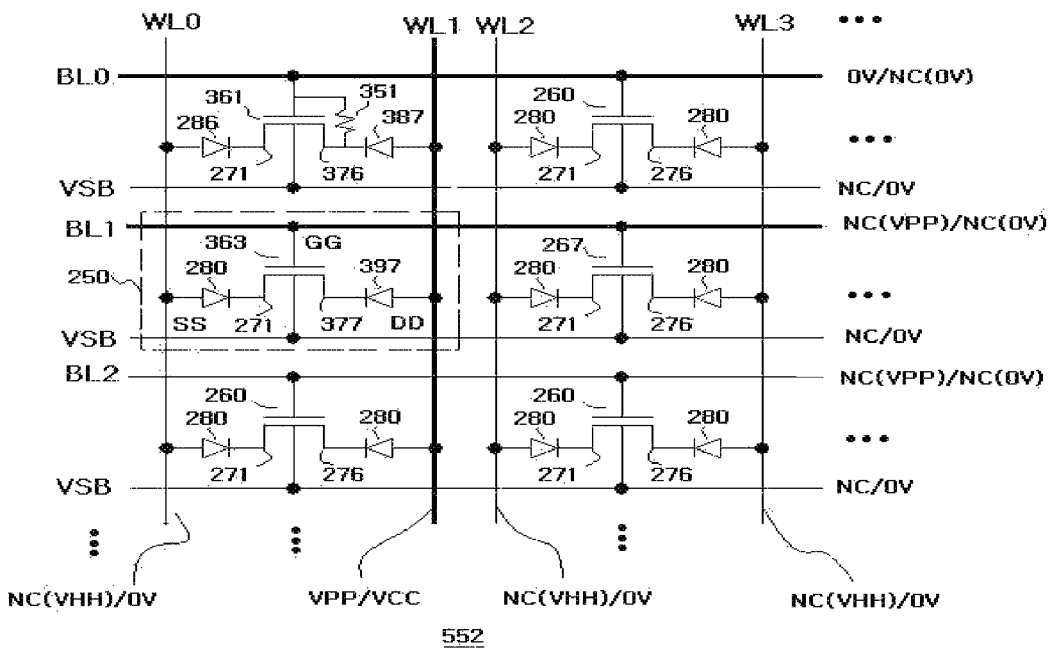
FIG. 8b illustrates a circuit diagram of the memory array-B illustrating the programming and read operations according to an aspect of present invention.

As illustrated in FIG. 8b, the programming operation in the memory array-B is explained as an example embodiment the present subject matter.

As illustrated in FIG. 8b, selection of WL1, BL0, and BL1 is shown in thick lines to help understanding as an example embodiment of the present invention.

In an example embodiment the present invention, the selected word line WL1 is biased to a VPP voltage in the floating state; other unselected word lines remain in the floating state.

Further VSB and unselected bit lines BL2, BL3, . . . become the floating state.

Storing data "0" through BL0 and data "1" through BL1 is an example embodiment.

As described earlier in detail, BL0 is biased to 0V to store data "0", BL1 is set to the floating state to store data "1".

Further, the selected word line WL1 is biased to VPP voltage and BL0 to 0V to forward-bias the second diode 286 so that it is programmed as data "0".

On the other hand, BL1 is in the floating state regardless WL1. Therefore, the drain region 376 of the cell transistor 361 is also in the floating state similar to BL1 even if the second diode 397 is forward-biased. Therefore, it is protected from programming and data "1" is stored since the initial storage state is preserved.

Figure 9A:
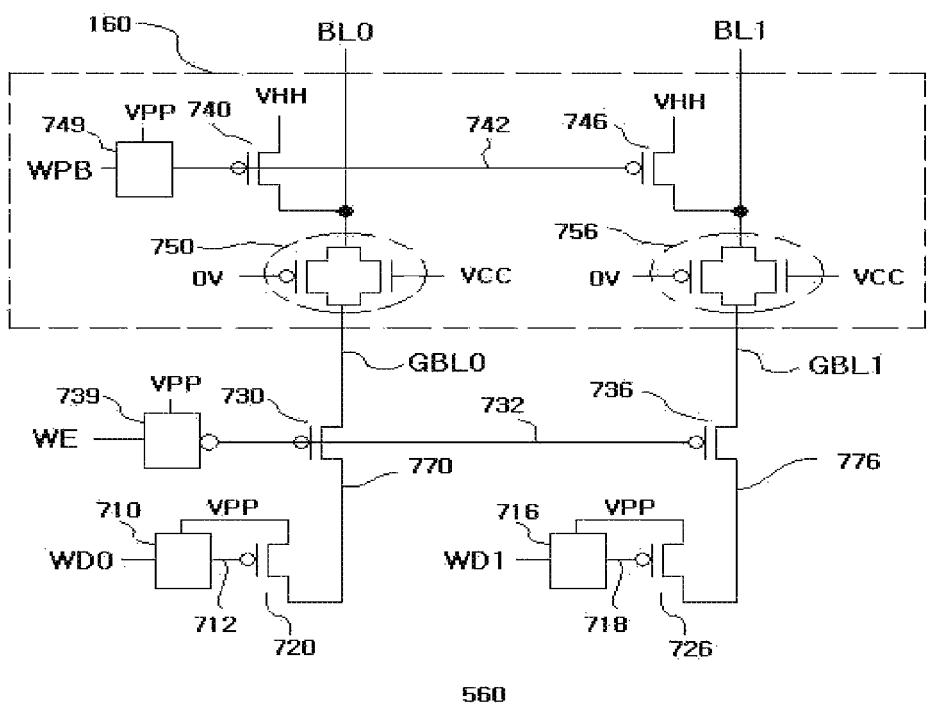
FIG. 9a illustrates a circuit diagram of a partial column decoder and write circuit to transfer data to the memory array-A according to an aspect of present invention.

FIG. 9a illustrates a partial column decoder and write circuit to transfer data to the memory array-A.

Figure 9B:
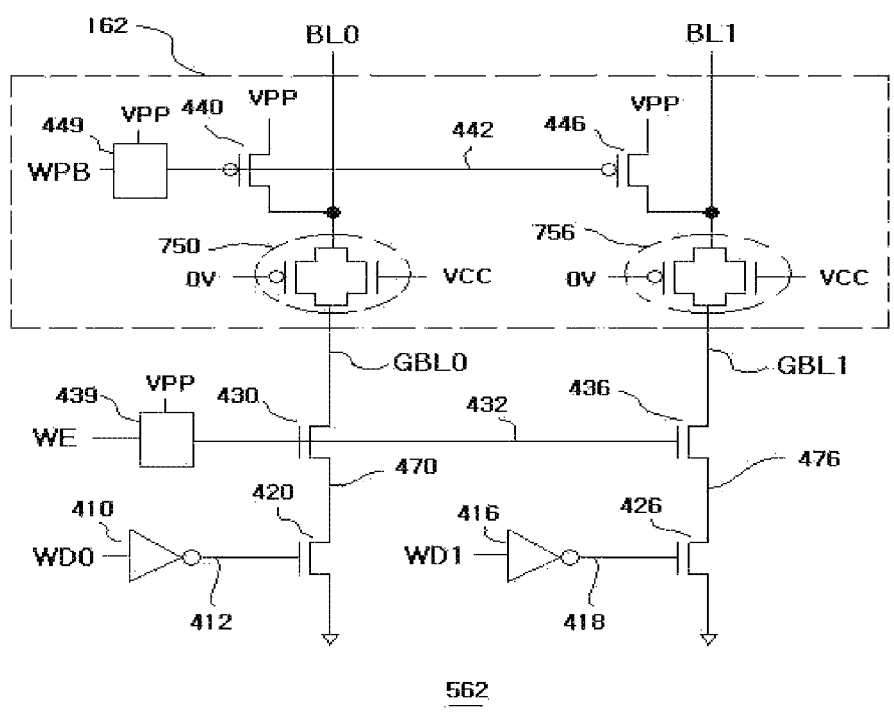
FIG. 9b illustrates a circuit diagram of a partial column decoder and write circuit to transfer data to the memory array-B according to an aspect of present invention.

FIG. 9b illustrates a partial column decoder and write circuit to transfer data to the memory array-B.

As illustrated in FIG. 9a and FIG. 9b, as an example embodiment, the programming operation is explained using a case that BL0, BL1, GBL0, and GBL1 are selected through transmission gates 750, 756 controlled by column decoding in column decoders 160, 162.

Therefore as illustrated in FIG. 9a and FIG. 9b, transmission gates 750, 756 are biased to VCC and 0V to turn on the channel of the selected transmission gates 750, 756.

There are transistors pre-charging the BL0 and BL1, controlled by a WPB signal. The pre-charge level is VHH and VPP in FIG. 9a and FIG. 9b, respectively.

In FIG. 9a, the global bit lines GBL0, GBL1, GBL2, . . . is either biased to VPP voltage or set to the floating state depending on the control of the write circuit and data.

In FIG. 9b, the global bit lines GBL0, GBL1, GBL2, . . . is either biased to 0V or set to the floating state depending on the control of the write circuit and data.

As illustrated in FIG. 9a, the write data input signals WD0, WD1 are either biased to VPP voltage to cause programming through level shifters 710, 716, pull-up transistors 720, 726, and pass transistors 730, 736; or set to the floating state to protect from programming.

As illustrated in FIG. 9b, the write data input signals WD0, WD1 are either biased to 0V to cause programming through inverters 410, 416, pull-down transistors 420, 426, and pass transistors 430, 436; or set to the floating state to protect from programming.

In an example embodiment the present subject matter, data "0" is stored through BL0 and data "1" is stored through BL1.

Therefore, the write data input signal WD0 becomes logic level "0" and the write data input signal WD1 becomes logic level "1".

According to an embodiment, the BL0 or BL1 are desired to be VHH voltage in FIG. 9a while VPP in FIG. 9b, before setting them to the floating state for a programming protection.

Since the BL0 or BL1 have to be pre-charged to VHH voltage in FIG. 9a while VPP in FIG. 9b, the WPB becomes logic level "0" before the word line WL1 us selected, during a write cycle.

Figure 10A:
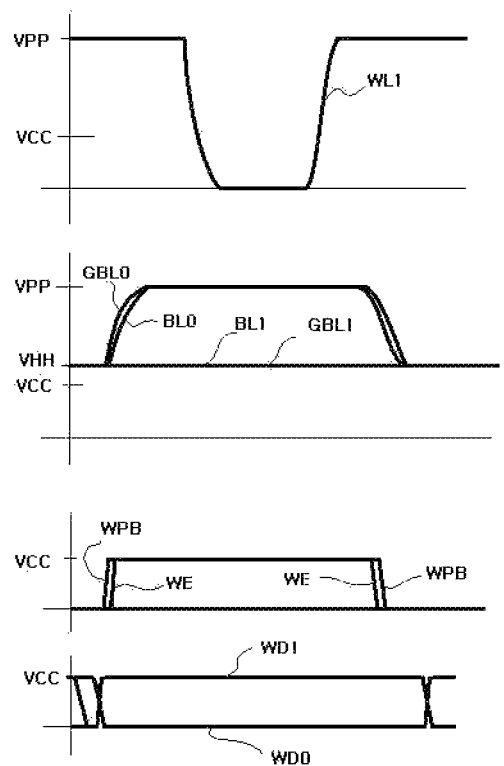
FIG. 10a illustrates a timing diagram illustrating that the data is programmed in the configuration-A memory device according to an aspect of present invention.

FIG. 10a illustrates a write cycle timing 670 for the memory array-A according to an aspect of present invention.

Figure 10B:
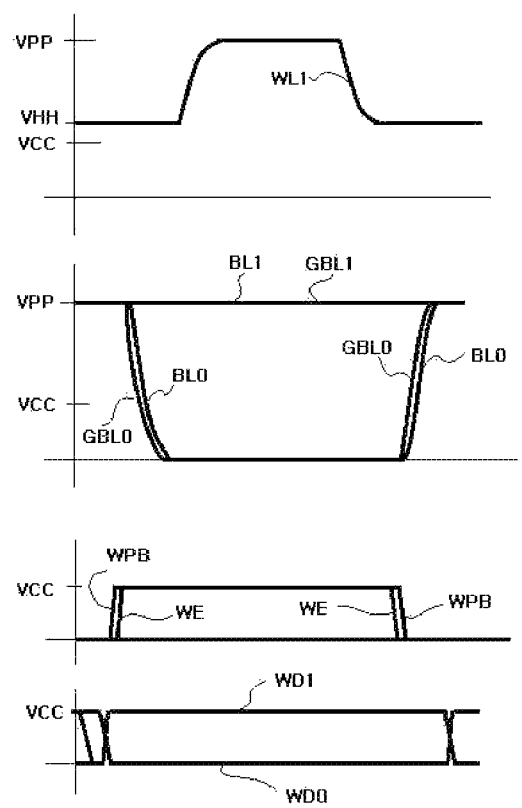
FIG. 10b illustrates a timing diagram illustrating that the data is programmed in the configuration-B memory device according to an aspect of present invention.

FIG. 10b illustrates a write cycle timing 672 for the memory array-B according to an aspect of present invention.

Since the WD0 has logic level "0", the gate 712 of the pull-up transistor 720 becomes 0V through a level shifter 710, making the drain 770 to a VPP voltage in FIG. 9a; the gate 412 of the pull-down transistor 420 becomes a VCC voltage through an inverter 410, making the drain 470 to 0V in FIG. 9b.

Since the WD1 has logic level "1", the gate 718 of the pull-up transistor 726 becomes VPP voltage through a level shifter 716, making the drain 770 the floating state in FIG. 9a; the gate 418 of the pull-down transistor 426 becomes 0V through an inverter 416, making the drain 476 the floating state in FIG. 9b.

As illustrated in FIG. 10a and FIG. 10b, a WPB becomes a logic level "1". Therefore, the gate 742 of the bit-line pre-charge transistors 740, 746 becomes a VPP voltage through a level shifter 749, finishing the pre-charge of BL0 and BL1 in FIG. 9a; the gate 442 of the bit-line pre-charge transistors 440, 446 becomes the VPP voltage through a level shifter 449, finishing the pre-charge of BL0 and BL1 in FIG. 9b. Subsequently a WE becomes the logic level "1".

As illustrated in FIG. 10a and FIG. 10b, the WE comes logic level "1". Therefore, in FIG. 9a, the gate 732 of the pass transistors 730, 736 becomes 0 V through a flipping-logic-level level shifter 739; channel becomes conductive; GBL0 and BL0 become the VPP voltage; GBL1 and BL1 become the floating state. In FIG. 9b, the gate 432 of the pass transistors 430, 436 becomes VCC voltage through a level shifter 439; channel becomes conductive; GBL0 and BL0 become zero voltage; GBL1 and BL1 become the floating state When WL1 is selected thus biased to 0 V; BL0 is biased to the VPP voltage as illustrated in FIG. 10a, the first diode 286 of the cell transistor 261 in FIG. 8a becomes conductive.

When WL1 is selected thus biased to VPP voltage; BL0 is biased to 0V as illustrated in FIG. 10b, the second diode 387 of the cell transistor 361 in FIG. 8b becomes conductive.

In FIG. 8a, the voltage at the source region 271 of the cell transistor 261 becomes about 5V, VPP voltage minus the threshold voltage of a diode; the voltage across the first anti-fuse, the gate oxide layer between the gate WL1 and source region 271, becomes a high voltage VAF voltage; gate breakdown occurs creating a resistive path. Namely, it is programmed and data "0" is stored.

Further, the drain region 276 of the cell transistor 261 is connected to BL1 with charges moving across then remains in the floating state. Therefore, gate breakdown does not occur in the second anti-fuse, the gate oxide layer between the gate WL1 and drain region 276; it is protected from programming; data "1" is stored.

In FIG. 8b, the voltage at the drain region 376 of the cell transistor 361 becomes about 5V, VPP voltage minus the diode threshold voltage; the voltage across the second anti-fuse, the gate oxide layer between the gate WL1 and drain region 376, becomes a high voltage VAF voltage; gate breakdown occurs creating a resistive path. Namely, it is programmed and data "0" is stored.

Further, the drain region 377 of the cell transistor 363 is connected to BL1 with charges moving across then remains in the floating state. Therefore, gate breakdown does not occur in the second anti-fuse, the gate oxide layer between the gate WL1 and drain region 377; it is protected from programming; data "1" is stored.

Further, as illustrated in FIG. 10a, WL1 is pre-charged to VPP voltage; the WE becomes logic level "0"; the WPB becomes logic level "0"; bit-line pre-charge transistors 740, 746 become conductive through a level shifter 749; GBL0 and GBL1 are pre-charged to VHH voltage again. Accordingly, the write cycle operation is performed.

In FIG. 10b, WL1 is pre-charged to VHH voltage; WE becomes logic level "0"; WPB becomes logic level "0"; bit-line pre-charge transistors 440, 446 become conductive through a level shifter 449; GBL0 and GBL1 are pre-charged to VPP voltage again. Thus, the write cycle operation is performed.

Programming can be checked by a read cycle operation in succession of the write cycle operation. Programming can be reinforced by repeating write and read. Failure can be also defined by limiting the number of repetition.

Reading the data stored in the memory cell is in principle checking the existence of the resistive path. When the stored state of the memory cell selected by the word line is transferred to the selected bit line, it is converted into the digital data by sense amplifiers 610, 616 that can detect and amplifies the electrical state of the bit line.

As illustrated in FIGS. 8a and 8b, the read operation in the memory arrays 550, 552 is explained as an example embodiment.

As an example, FIG. 8a assumes that the first anti-fuse, the gate oxide layer between the gate WL1 and source region 271 of the cell transistor 261, has a resistive path, storing data "0" while the second anti-fuse, the gate oxide layer between the gate WL1 and drain region 276 of the cell transistor 261, does not have a resistive path, storing data "1". The resistive path 251 storing data "0" is illustrated in thick line to help understanding.

As illustrated in FIG. 8a, the resistive path 251 between the gate and source region 271 of the cell transistor 261 storing data "0," is represented by a resistor device. This will be a basis that the stored data is detected as "0" in the read operation to be described below.

As illustrated in FIG. 8a, in one embodiment example of the present subject matter, VSB is biased to 0V; unselected bit lines BL2, BL3, . . . are in the floating state.

Similar to FIG. 8a, FIG. 8b assumes that the second anti-fuse, the gate oxide layer between the gate WL1 and drain region 376 of the cell transistor 361, has a resistive path represented by a resistor device 351, storing data "0".

As one embodiment example of the present subject matter, unselected word lines WL0, WL2, WL3, . . . are biased to power supply VCC voltage in FIG. 8a while biased to 0V in FIG. 8b.

According to the present subject matter, BL0 and BL1 have to be pre-charged to VCC voltage before the WL1 is selected and become 0V in FIG. 8a.

According to the present subject matter, BL0 and BL1 have to be pre-charged to 0V before the WL1 is selected and become VCC voltage in FIG. 8b.

In FIG. 8a, when the WL1 is selected, WL1 becomes 0V conducting through the first diode connected to BL0 and the resistive path 251. Therefore the voltage of BL0 becomes close to the threshold voltage of a diode.

In FIG. 8b, when the WL1 is selected, WL1 becomes VCC voltage conducting through the second diode connected to BL0 and the resistive path 351. Therefore the voltage of BL0 becomes close to the VCC minus the threshold voltage of a diode.

In FIG. 8a, the second diode connected to BL1 is in series connection with the gate capacitance of the cell transistor. Hence it can be raised to the conduction state via coupling when the WL1 becomes 0V.

In such a case, charges move across BL1 and the drain region 276 of the cell transistor but the parasitic capacitance of BL1 is much larger than drain 276. Therefore, BL1 experiences almost no change in voltage that is about the same as pre-charged VCC voltage in the floating state.

In FIG. 8b, similar to FIG. 8a, BL1 becomes nearly pre-charged 0V in the floating state when the WL1 becomes VCC voltage.

Figure 11A:
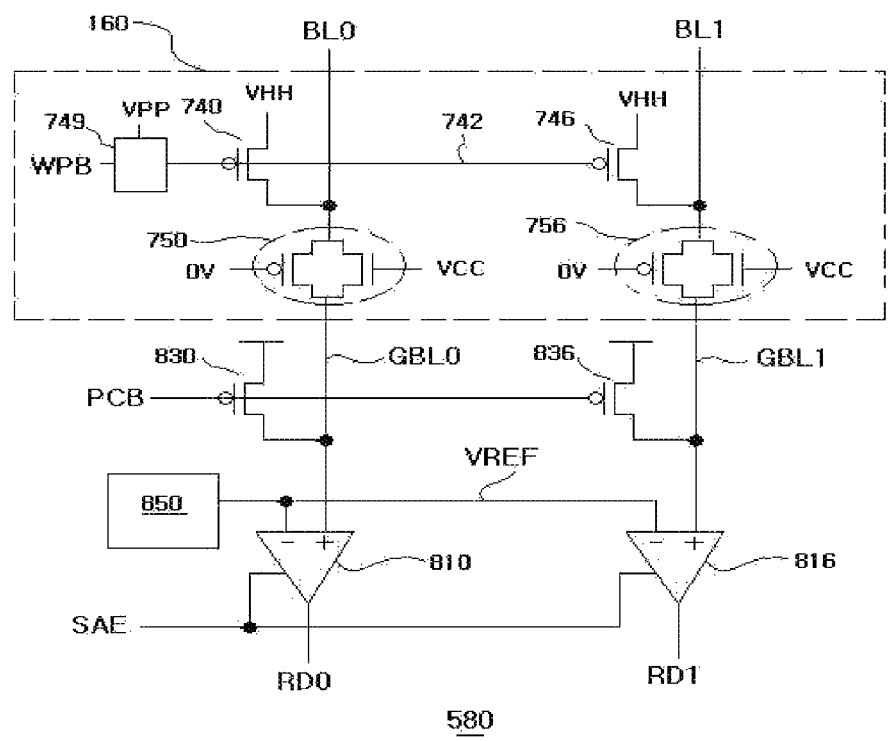
FIG. 11a illustrates a circuit diagram of a partial column decoder and read circuit detecting the data stored in the memory array-A by the sense amplifier according to an aspect of present invention.

FIG. 11a is a circuit diagram reading the data stored in the memory array-A in the present subject matter.

Figure 11B:
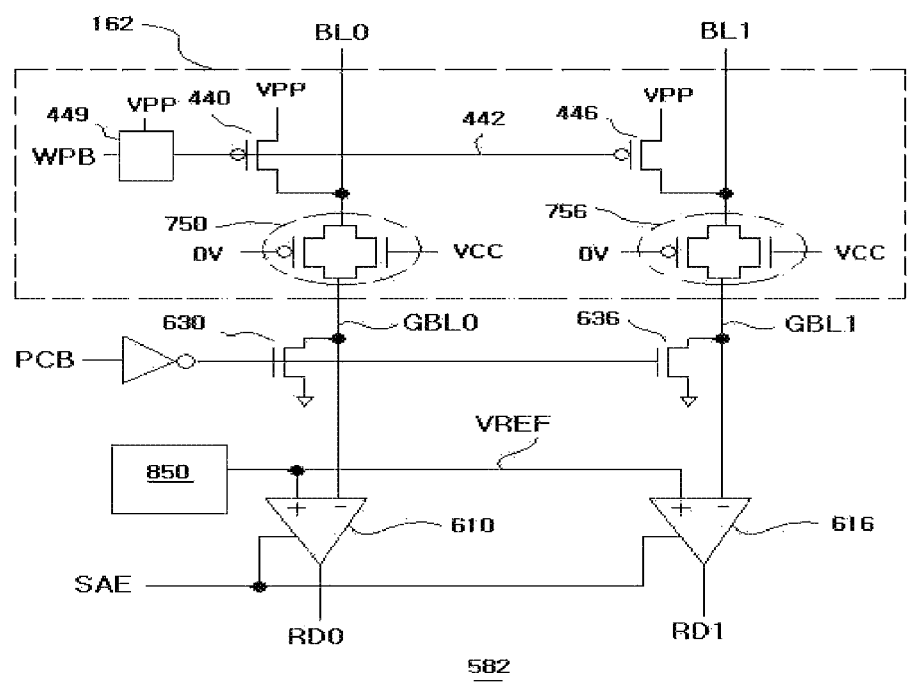
FIG. 11b illustrates a circuit diagram of a partial column decoder and read circuit detecting the data stored in the memory array-B by the sense amplifier according to an aspect of present invention.

FIG. 11b is a circuit diagram reading the data stored in the memory array-B in the present subject matter.

In an example embodiment the present subject matter, as illustrated in FIG. 11a and FIG. 11b, bit lines BL0, BL1 are connected to GBL0 & GBL1 through column decoders 160, 162 and selected by column decoding.

As illustrated in FIG. 11a and FIG. 11b, the column decoders 160, 162 are not an addition of circuit but shared with the write circuit 170. They are illustrated merely to help understanding of a read circuit.

According to the present subject matter in FIG. 11a and FIG. 11b, the WPB always may maintain logic level "1" and VPP/VHH voltage is adjusted to VCC voltage when the circuit is not in programming operation.

FIG. 11a has p-channel MOS transistors 830, 836 to pre-chart the GBL0 & GBL1 to VCC voltage; FIG. 11b has n-channel MOS transistors 630, 636 to pre-charge the GBL0 & GBL1 to 0V.

FIG. 11a and FIG. 11b have sense amplifiers 810, 816, 610, 616 to detect the stored data, the electrical state of the BL0 & BL1 transferred to GBL0 & GBL1.

In an example embodiment the present subject matter, as illustrated in FIG. 11a and FIG. 11b, the sense amplifiers 810, 816, 610, 616 operate when a SAE becomes logic level "1"; amplify and latch the difference between the reference voltage VREF and input signals GBL0, GBL1 voltage; then outputs to output terminals RD0, RD1.

A latch-style sense amplifier can be a desirable example for the sense amplifiers 810, 816, 610, 616. As the architecture of the sense amplifier is well known, it would not be further explained in detail.

In FIG. 11a, the input signals GBL0, GBL1 of the sense amplifiers 810, 816 change from VCC voltage to the threshold voltage of a diode Vd when the stored data is "0"; maintain VCC voltage with almost no change when the stored data is "1".

Therefore, the VREF can be set to the average value of VCC and the threshold voltage of a diode Vd. It also can be set to the value closer to VCC for a high speed operation.

In an example embodiment the present subject matter in FIG. 11a, VREF is set to "VCC−0.2V"

Referring now, VCC is 1.2V and VREF is 1V.

The VREF is supplied from the VREF generator 850.

When the SAE becomes logic level "1", the sense amplifier operates: RD0 becomes logic level "0" if GBL0>1V; or logic level "1" if GBL0<1V.

Figure 12A:
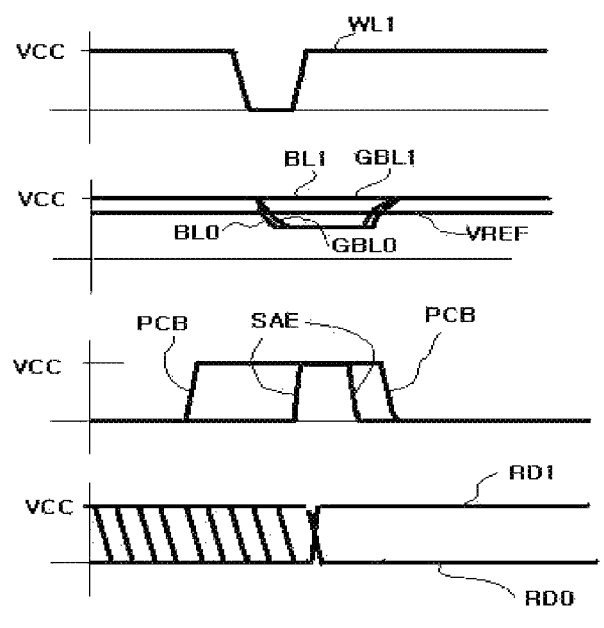
FIG. 12a illustrates a timing diagram illustrating that the data is read in the configuration-A memory device according to an aspect of present invention.

FIG. 12a illustrates read cycle timing with respect to the read operation.

Before WL1 is selected and becomes logic level "1", PCB becomes logic level "0" and GL0 & GL1 are pre-charged to VCC voltage by pre-charge transistors 830, 836.

In FIG. 11b, the input signals GBL0, GBL1 of the sense amplifiers 610, 616 change from 0V to Vcc−Vd when the stored data is "0"; maintain 0V with almost no change when the stored data is "1".

Therefore, the VREF can be set to a half of VCC−Vd. It also can be set to a smaller value for a high speed operation.

In an example embodiment the present subject matter in FIG. 11b, VREF is set to 0.2V.

When the SAE becomes logic level "1", the sense amplifier operates: RD0 becomes logic level "0" if GBL0<0.2V; or logic level "1" if GBL0>0.2V.

Figure 12B:
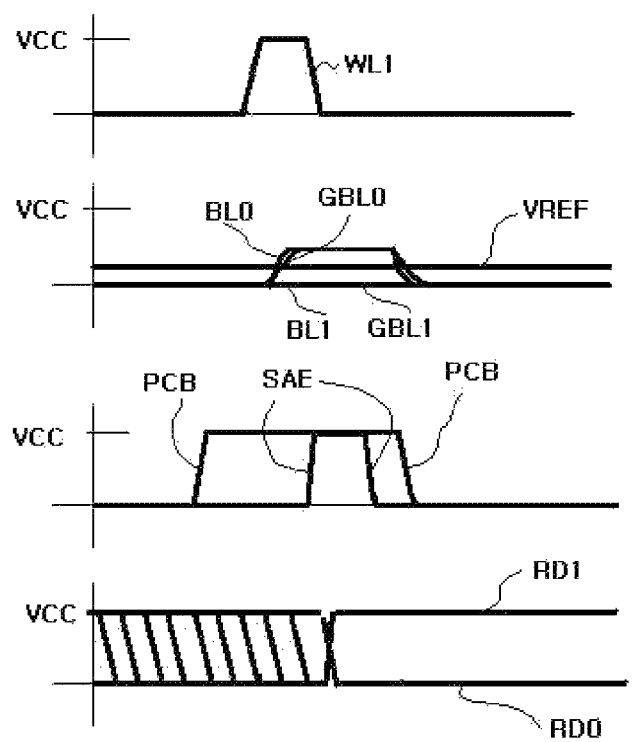
FIG. 12b illustrates a timing diagram illustrating that the data is read in the configuration-B memory device according to an aspect of present invention.

FIG. 12b illustrates read cycle timing with respect to the read operation.

Before WL1 is selected and becomes logic level "1", PCB becomes logic level "0" and GL0 & GL1 are pre-charged to 0V by pre-charge transistors 630, 636.

In the read operation of configuration-A, WL1 is selected and biased to 0V; BL0 is in the floating state pre-charged to VCC voltage.

As illustrated in FIG. 8a, in the cell transistor 261 connected to WL1 and BL0, the resistive path 251 in the first anti-fuse is in series connection with the first diode; the diode is forward-biased. Therefore current flows while WL1 is selected, lowering the voltage of BL0 and GBL0 to the threshold voltage of a diode Vd. In an example embodiment the present subject matter, the GBL0 is assumed to be lowered from VCC voltage to 0.5V.

When WL1 is selected and biased to 0V, the cell transistor 261 connected to WL1 and BL1 has no resistive path. Therefore, current does not flow in the second diode after the second anti-fuse is charged.

Charges can move across BL1 and the cathode of the second diode but the parasitic capacitance of BL1 is much larger than the cathode of the second diode. Therefore, BL1 & GBL1 becomes close to VCC voltage experiencing almost no change in voltage.

When the SAE becomes logic level "1" as illustrated in FIG. 12a, the sense amplifier amplifies: 0.5V in GBL0 which is smaller than 1V VREF, latching RD0 to logic level "0"; VCC in GL1 which is larger than 1V VREF, latching RD1 to logic level "1".

The operation of the sense amplifiers 810, 816 is finished with further WL1 becoming VCC voltage and the SAE becoming logic level "0". As illustrated in FIG. 12a, PCB becomes logic level "0"; GBL0 and GBL1 are pre-charged to VCC voltage again. Thus the read cycle operation is completed.

In the read operation of configuration-B, WL1 is selected and biased to VCC voltage; BL0 is in the floating state pre-charged to 0V.

As illustrated in FIG. 8b, in the cell transistor 361 connected to WL1 and BL0, the resistive path 351 in the second anti-fuse is in series connection with the second diode; the diode is forward-biased. Therefore current flows while WL1 is selected, raising the voltage of BL0 and GBL0 to Vcc−Vd. In an example embodiment the present subject matter, the GBL0 is assumed to be raised from 0V to 0.5V.

When WL1 is selected and biased to VCC voltage, the cell transistor 361 connected to WL1 and BL1 has no resistive path. Therefore, current does not flow in the second diode after the second anti-fuse is charged.

Charges can move across BL1 and the cathode of the second diode but the parasitic capacitance of BL1 is much larger than the cathode of the second diode. Therefore, BL1 & GBL1 becomes close to 0V experiencing almost no change in voltage.

When a SAE becomes logic level "1" as illustrated in FIG. 12b, the sense amplifier amplifies: 0.5V in GBL0 which is larger than 0.2V VREF, latching RD0 to logic level "0"; 0V in GL1 which is smaller than 0.2V VREF, latching RD1 to logic level "1".

The operation of the sense amplifiers 610, 616 is finished with further WL1 becoming 0V and the SAE becoming logic level "0". As illustrated in FIG. 12b, PCB becomes logic level "0"; GBL0 and GBL1 are pre-charged to 0V again. Accordingly, the read cycle operation is completed.

Figure 13:
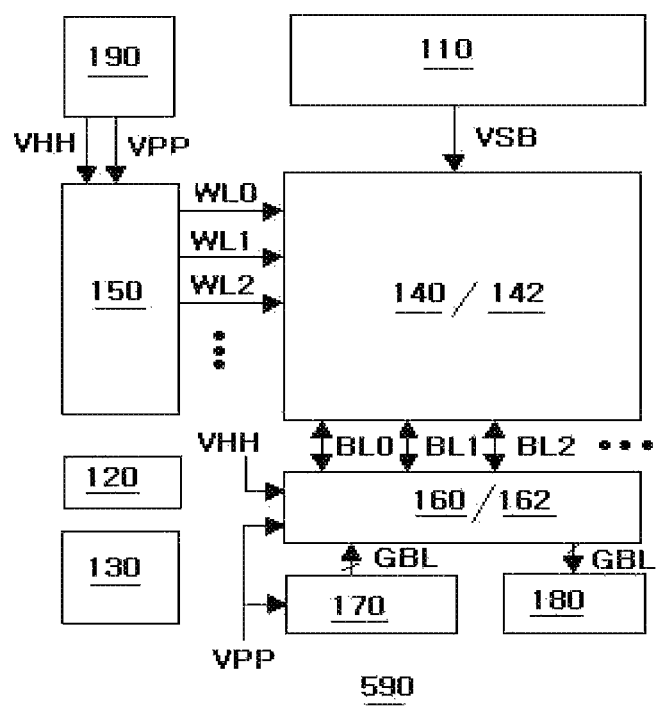
FIG. 13 illustrates a block diagram illustrating a configuration of the memory device according to an aspect of present invention.

In an example embodiment the present subject matter, FIG. 13 illustrates a configuration of the memory device according to an aspect of present invention.

A memory array arranging multiple the memory cells; a VSB supply generating VSB used for the memory array; a row decoder to select a word line in the memory array; a VPP supply generating VPP and VHH and supplying to the row decoder, a column decoder, and a write circuit; the column decoder selecting a bit line; the write circuit transferring the supplied data bus from input/output circuits to the global bit line bus GBL under controller's control; a read circuit transferring the stored data to the global bit line GBL, sensing the electrical status of GBL by the sense amplifier, amplifying/converting to a digital signal, and transferring to the input/output circuit; a controller controlling inside; and input/output circuits interfacing inside and outside of the memory.

In a brief configuration, the memory device has the memory arrays 140 or 142 described earlier in detail and a VSB supplier 110 generating VSB used by the memory arrays 140 or 142.

The memory device uses a high voltage VPP for the programming and a pre-charge voltage VHH for a programming protection and a high speed operation. Therefore it has a VPP generator 190 that generates and supplies VPP & VHH to a row decoder 150, a column decoder 160 or 162, and a write circuit 170.

In the VPP generator 190, VPP & VHH voltage are adjusted to VCC voltage when the device is not in the programming operation.

The memory device also has a row decoder 150 selecting word lines and a column decoder 160 selecting bit lines in the memory array 140 or 142.

As illustrated in FIG. 13, the row decoder 150 and column decoder 160 or 162 receive the address bus from input/output circuits 130, are controlled by a controller 120, and decode the address. The row decoder 150 receives VPP & VHH voltage from the VPP generator 190 as it uses VPP & VHH voltage for the programming operation according to an aspect of present invention.

The memory device has a write circuit 170 required for the data write operation. The write circuit receives the data bus from input/output circuits 130, is controlled by a controller 120, and transfers the data to GBL global bit line buses GBL0, GBL1, GBL2, . . . .

As illustrated in FIG. 13, the memory device has a read circuit 170 used for the data read operation. When the saved data is transferred to the global bit line buses GBL0, GBL1, GBL2, . . . , the sense amplifier detects the electrical status of GBL, amplifies to digital signal, and transfers to the input/output circuit 130.

The input/output circuit 130 interfaces inside and outside of the memory. The controller 120 receives commands supplied to the input/output circuit 130 for write and read operations, interprets the commands in detail, and controls related circuits.

Since the configuration of an example embodiment the present subject matter can be alternatively embodied, the present subject matter is not restricted to the OTP One-Time Programmable memory device but can be embodied in others including the fuse of the redundancy repair used in various semiconductor memory devices like DRAM, SRAM, etc.

While the present subject matter is susceptible to various modifications and alternative forms, specific embodiments thereof have been shown by way of example in the drawings and are herein described in detail. It should be understood, however, that the description herein of specific embodiments is not intended to limit the subject matter to the particular forms disclosed, but on the contrary, the intention is to cover all modifications, equivalents, and alternatives falling within the spirit and scope of the present subject matter as defined by the appended claims.

What is claimed is:

1. A programmable non-volatile memory comprising a cell transistor including a transistor which can store two bits as a memory cell and two diodes to access the transistor, wherein a first diode of the two diodes is formed by a contact structure between a source electrode formed by a conductive material and a source region of the cell transistor and a second diode of the two diodes is formed by a contact structure between a drain electrode formed by the conductive material and a drain region of the cell transistor, wherein the transistor comprises a first anti-fuse to store one of the two bits and a second anti-fuse to store the other of the two bits, the first anti-fuse is formed by an oxide layer disposed between the source region and a gate of the cell transistor, and the second anti-fuse is formed by the oxide layer disposed between the drain region and the gate, wherein an anode of the first diode connects to the source side (SS), wherein a anode of the second diode connects to the drain side (DD), wherein a body of the cell transistor connects to a substrate electrode (VSB), wherein the first anti-fuse and first diode have the gate as a common electrode, wherein the gate connects to a gate electrode (GG), wherein the first anti-fuse and first diode form the first bit cell storing single-bit in series connection structure sharing the source region, wherein the second anti-fuse and second diode form the second bit cell storing single-bit in series connection structure sharing the drain region.

2. The programmable non-volatile memory according to claim 1, wherein the first and second diodes are Schottky diodes comprise source/drain electrodes formed by a metal and the contact structures of the source/drain region are lightly-doped.

3. The programmable non-volatile memory according to claim 1, wherein the GG connects to a word line and the SS/DD connects to a bit line; or conversely the GG connects to the bit line and the SS/DD connects to the word line.

4. The programmable non-volatile memory according to claim 1, wherein a voltage is applied across the first and the second anti-fuses to cause gate breakdown at the gate oxide layer anti-fuses, thereby creating a resistive path.

5. The programmable non-volatile memory according to claim 1, wherein the GG is biased to 0V while the VSB is in floating state during the programming operation of the memory cell, wherein the SS is biased to a high voltage (VPP) during the first bit cell programming, wherein the DD is biased to the VPP during the second bit cell programming, wherein the SS is in floating state to protect the first bit cell programming while the programming operation, wherein the DD is in floating state to protect the second bit cell programming while the programming operation.

6. The programmable non-volatile memory according to claim 1, wherein the memory further comprising: a column decoder includes a bit-line pre-charge circuit comprising transistors that pre-charge the bit-lines BL0, BL1 to a half of the high voltage (VHH) and controlled by receiving a write pre-charge signal WPB, during the write operation connecting the GG to a word line and the SS and the DD to their respective bit lines.

7. The programmable non-volatile memory according to claim 1, wherein the memory includes a read circuit that comprises bit lines connected to global bit lines GBL0, GBL1 and selected by a column decoder during the read operation that connects the GG to the word line and the SS and the DD to their respective bit lines, wherein a read circuit further comprises transistors to pre-charge the global bit lines GBL0, GBL1 to a power supply voltage (VCC) wherein the read circuit further comprises a sense amplifier that detects the stored data transferred from the bit lines BL0, BL1 to global bit lines GBL0, GBL1.

8. The programmable non-volatile memory according to claim 1, wherein the memory further comprising: a memory array to arrange multiple the memory cells; a VSB supply to generate the VSB used for the memory array; a row decoder to select a word line in the memory array; a column decoder to select the word line in the memory array; a high voltage (VPP) supply to generate a high voltage (VPP) and a half of the high voltage (VHH) and to supply to the row decoder, the column decoder, and a write circuit; the column decoder to select a bit line; the write circuit to transfer a supplied data bus from input/output circuits to a global bit line bus GBL under controller's control; a read circuit to transfer a stored data to a global bit line GBL, to sense the electrical status of GBL by a sense amplifier, amplifying/converting to a digital signal, and to transfer to the input/output circuit; a controller controlling inside; and input/output circuits interfacing inside and outside of the memory.

9. The programmable non-volatile memory according to claim 1, wherein the column decoder includes a bit-line pre-charge circuit comprising transistors that pre-charge the bit-lines BL0, BL1 to VPP voltage and controlled by receiving a write pre-charge signal WPB, during the write operation connecting the SS and the DD to their respective word lines.

10. The programmable non-volatile memory according to claim 1, wherein the memory includes bit-lines BL0, BL1 connected to global bit-lines GBL0, GBL1 and selected by column decoding; transistors to pre-charge the global bit-lines GBL0, GBL1 to zero volt; and sense amplifiers detecting the stored data transferred from the bit lines BL0, BL1 to global bit lines GBL0, GBL1.

11. The programmable non-volatile memory according to claim 1, wherein the diodes are either typical P-N junction diodes or any devices with uni-directional current characteristics, besides Schottky diodes comprise source/drain electrodes formed by a metal and the contact structures of the source/drain region are low-doped.

12. The programmable non-volatile memory according to claim 1, wherein the cathode of the first diode connects to the source side SS, wherein the cathode of second diode connects to the drain side DD, wherein the body of the cell transistor connects to the VSB, wherein the first anti-fuse and first diode have the gate as a common electrode, wherein the gate connects to the GG, wherein the first anti-fuse and first diode forms the first bit cell storing single-bit in series connection structure sharing the source region, wherein the second anti-fuse and second diode forms the second bit cell storing single-bit in series connection structure sharing the drain region.

13. The programmable non-volatile memory according to claim 1, wherein 0V is applied to the selected word line while other unselected word lines are pre-charged to the VPP voltage and left to the floating state during a write operation of memory array that connects the GG to the word line and the SS and the DD to their respective bit lines.

14. The programmable non-volatile memory according to claim 1, wherein the VPP is applied to the selected word line while other unselected word lines are pre-charged to the VHH and left to the floating state during a write operation of memory array that connects the GG to the bit line and the SS and the DD to their respective word lines.

15. The programmable non-volatile memory according to claim 1, wherein 0V is applied to the selected word line while other unselected word lines are biased to the VCC during a read operation of memory array that connects the GG to the word line and the SS and the DD to their respective bit lines.

16. The programmable non-volatile memory according to claim 1, wherein the VCC voltage is applied to the selected word line while other unselected word lines are biased to 0V during a read operation of memory array that connects the GG to the bit line and the SS and the DD to their respective word lines.

* * * * *